(12) United States Patent
Shibuya et al.

(10) Patent No.: US 9,129,073 B2
(45) Date of Patent: Sep. 8, 2015

(54) SHAPE OPTIMIZATION METHOD

(75) Inventors: Sadao Shibuya, Shioya-gun (JP); Ryota Nishioka, Utsunomiya (JP); Tomohiro Aoyama, Sakura (JP)

(73) Assignee: HONDA MOTOR CO., LTD., Tokyo (JP)

( * ) Notice: Subject to any disclaimer, the term of this patent is extended or adjusted under 35 U.S.C. 154(b) by 871 days.

(21) Appl. No.: 13/349,146

(22) Filed: Jan. 12, 2012

(65) Prior Publication Data
US 2012/0191422 A1 Jul. 26, 2012

(30) Foreign Application Priority Data
Jan. 24, 2011 (JP) .................. 2011-011938

(51) Int. Cl.
*G06F 17/50* (2006.01)
(52) U.S. Cl.
CPC ............ *G06F 17/50* (2013.01); *G06F 17/5018* (2013.01)
(58) Field of Classification Search
CPC ............................. G06F 17/50; G06F 17/5018
USPC ........................................................ 703/1, 2
See application file for complete search history.

(56) References Cited

U.S. PATENT DOCUMENTS

| | | | |
|---|---|---|---|
| 6,876,956 B1 | 4/2005 | Cirak et al. | |
| 8,832,980 B2 * | 9/2014 | Hill | ............................ 40/606.12 |
| 2010/0303537 A1 * | 12/2010 | Brown et al. | ................... 403/14 |

FOREIGN PATENT DOCUMENTS

JP 06-331506 12/1994

OTHER PUBLICATIONS

Lei Wang, et al: "Free Form Design for Single Layer Shell Structures", Progress in Informatics and Computing (PIC), 2010 IEEE International Conference on, IEEE, Piscataway, NJ, USA, Dec. 10, 2010, five pages.
Choi, W S et al: "Shape Optimization of a Perforated Pressure Vessel Cover Under Linearized Stress Constraints", Nuclear Engineering and Design, Amsterdam, NL, vol. 238, No. 9, Sep. 1, 2008, five pages.

* cited by examiner

*Primary Examiner* — Kamini S Shah
*Assistant Examiner* — Andre Pierre Louis
(74) *Attorney, Agent, or Firm* — Rankin, Hill & Clark LLP

(57) ABSTRACT

A shape optimization method of a plate-like member which has a concavo-convex shape and includes: identifying a bend stress point where a bend stress is higher in a mode where a specific load is applied to the plate-like member; identifying a bend axis from a distribution of stress vectors around the bend stress point; identifying, in an orthogonal surface to the bend axis, a pair of membrane stress points where a ratio of a membrane stress to a sum of the bend stress and the membrane stress is higher; calculating an offset variable which is a distance between a line segment connecting the pair of the membrane stress points and the bend stress point; and identifying a shape of the plate-like member so as to minimize the offset variable.

6 Claims, 13 Drawing Sheets

FIG. 6
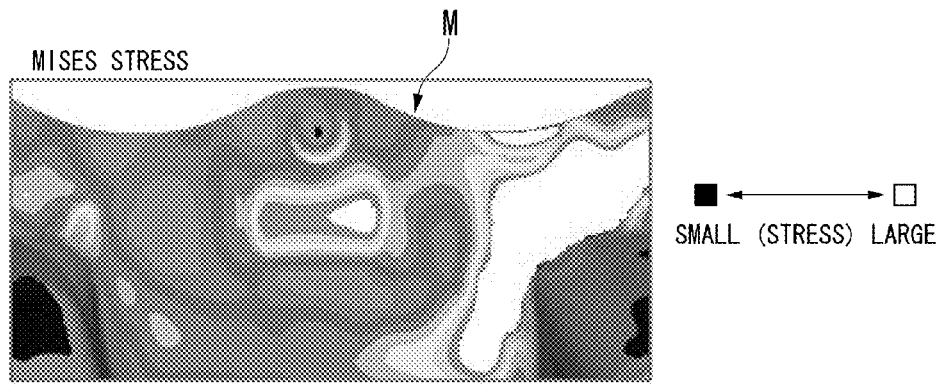
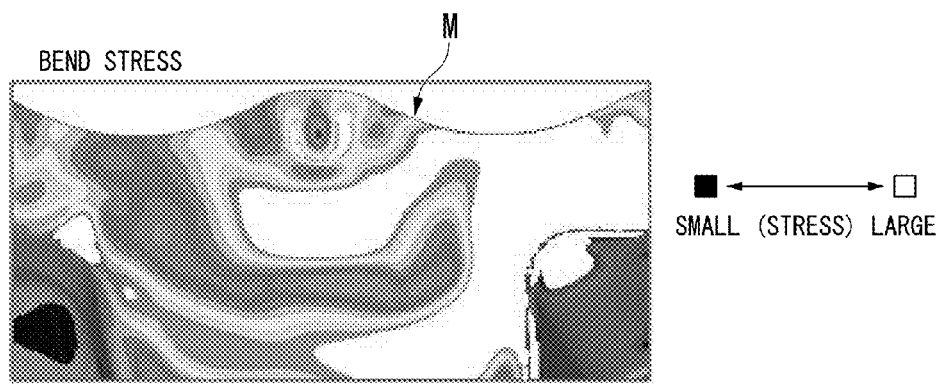
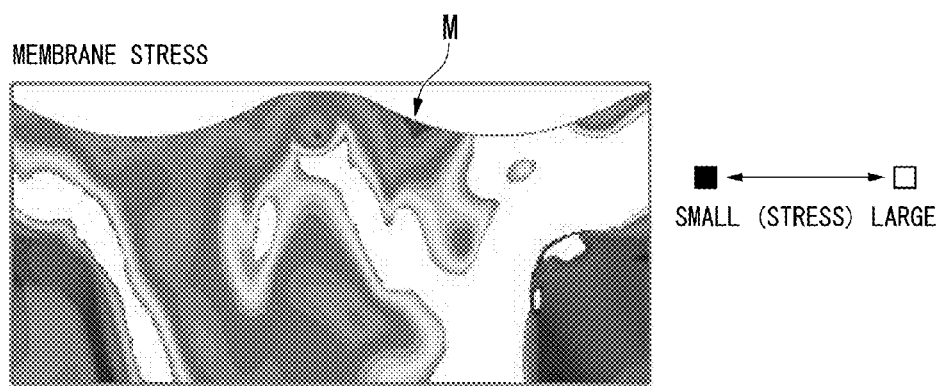

FIG. 9
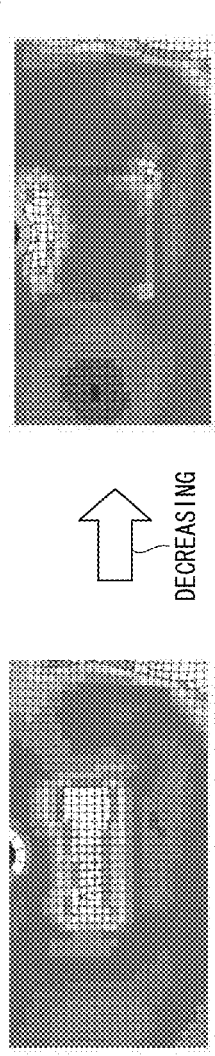
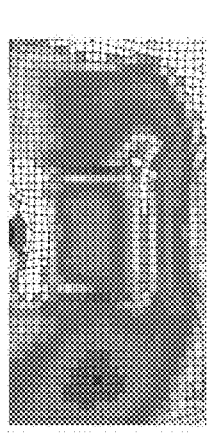
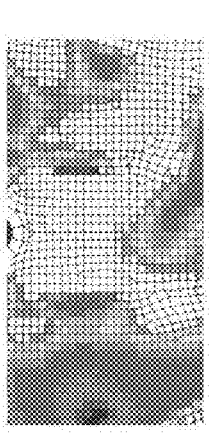
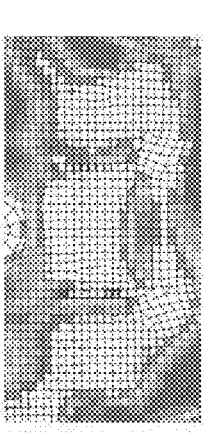

SHAPE OPTIMIZATION METHOD

CROSS-REFERENCE TO RELATED APPLICATION

Priority is claimed on Japanese Patent Application No. 2011-011938, filed on Jan. 24, 2011, the contents of which are incorporated herein by reference in its entirety.

BACKGROUND

1. Field of the Invention

The present invention relates to a shape optimization method.

2. Description of Related Art

Traditionally, for example, a method that performs a structural analysis on the basis of an actual construction of structures with use of such as a finite element method is known (for example, see Japanese Unexamined Patent Application, First Publication No. H6-331506).

SUMMARY

In the method according to the above-mentioned conventional technology, it is difficult to analyze a stress which is an evaluative standard of fatigue strength of the structure and the shape of the structure based on a correspondence therebetween. When a shape-change depending on the stress is performed depending on an instruction by an operator (for example, when the operator changes the shape referring to such as a stress distribution), there is problem that a complicated effort is required and an acceptability of the shape-change is turned depending on the operator's skill and time-consuming effort.

Moreover, in various shape parameters which are changeably set relating to the shape of the structure, if only initially set values of the shape parameters are changeable, shape-changeable places in the structure are fixed and an optimum shape is acquired within only a shape range depending on the initial values of the shape parameters. Thus, a problem is caused that an appropriate shape-change depending on the stress cannot be performed.

Aspects according to the present invention have been made in view of the above circumstances, the purpose is to provide a shape optimization method that can perform the appropriate shape-change depending on the stress.

(1) In order to solve the problem and achieve the object related thereto, an aspect according to the present invention provides a shape optimization method of a plate-like member which has a concavo-convex shape, the method including: identifying a bend stress point where a bend stress is higher in a mode where a specific load is applied to the plate-like member; identifying a bend axis from a distribution of stress vectors around the bend stress point; identifying, in an orthogonal surface to the bend axis, a pair of membrane stress points where a ratio of a membrane stress to a sum of the bend stress and the membrane stress is higher; calculating an offset variable which is a distance between a line segment connecting the pair of the membrane stress points and the bend stress point; and identifying a shape of the plate-like member so as to minimize the offset variable.

(2) In the aspect according to (1), the method may further include: calculating a first distance and a second distance that are distances from an intersection point of a perpendicular line, which is drawn from the bend stress point to the line segment, to the pair of membrane stress points; and identifying the shape of the plate-like member so as to maximize the first and second distances.

(3) In the aspect according to (2), the method may include, in a case of repeatedly executing the shape optimization method to identify the shape of the plate-like member, re-identifying the bend stress point and the pair of the membrane stress points in the shape of the plate-like member which is identified in a previous execution, and re-calculating the offset variable and the first and second distances based on the re-identified bend stress point and the re-identified pair of the membrane stress points.

(4) In the aspect according to (1) or (2), the method may include, in a case of repeatedly executing the shape optimization method to identify the shape of the plate-like member, re-identifying the bend stress point and the pair of the membrane stress points in the shape of the plate-like member which is identified in a previous execution, and re-calculating the offset variable based on the re-identified bend stress point and the re-identified pair of the membrane stress points.

According to the aspect described in (1), the bend stress and the membrane stress which are the evaluative standards of the fatigue strength of the plate-like member and the shape of the plate-like member can be analyzed based on the correspondence therebetween with use of the offset variable.

Furthermore, for example, within the allowable shape range depending on requests from the designer side for the plate-like member, by identifying the shape of the plate-like member so as to minimize the offset variable, in the specific load which acts on the plate-like member, the bend stress is converted into the membrane stress. Accordingly, the Mises stress which is the evaluative standard of the fatigue strength of the plate-like member may be reduced, and thus the optimum shape of the plate-like member may be appropriately identified.

In the case of the aspect described in (2), the accuracy in analyzing the bend stress and the membrane stress, and the shape of the plate-like member based on a correspondence thereamong can be improved with use of the first and second distances in addition to the offset variable.

Furthermore, for example, within the allowable shape range depending on the requests from the designer side for the plate-like member, by identifying the shape of the plate-like member so as to maximize the first and second distances, the bend stress is further converted into the membrane stress. Accordingly, Mises stress which is the evaluative standard of the fatigue strength of the plate-like member can be reduced much more, and thus the optimum shape of plate-like member can be appropriately identified.

In the case of the aspect described in (3), in the case of repeatedly executing the shape optimization method, the shape parameter based on the offset variable and the first and second distances can be independently and flexibly set without depending on, for example, an initial setting and a past setting; the appropriate shape-change depending on the stress can be performed; and the accuracy of the shape optimization can be improved.

In the case of the aspect described in (4), in a case of repeatedly executing the shape optimization method, at least the offset variable can be independently and flexibly set without depending on such as the initial setting and the past setting, the appropriate shape-change depending on the stress can be performed, and the accuracy of the shape optimization can be improved.

BRIEF DESCRIPTION OF THE DRAWINGS

FIG. 6 is a diagram showing examples of distributions of various stresses, for example, a distribution of Mises stresses, a distribution of bend stresses, and a distribution of membrane stresses in a mode where a specific load is applied to the plate-like member M which is to be processed using the shape optimization method according to the embodiment of the present invention.

FIG. 9 is a diagram showing examples of, before and after a shape-change, distributions of the Mises stresses, distributions of the bend stresses, distributions of the membrane stresses, and distributions of the ratio of the membrane stress to the sum of the bend stress and the membrane stress in a mode where a specific load is applied to the plate-like member M which is to be processed using the shape optimization method according to the embodiment of the present invention.

DESCRIPTION

Hereinafter, a shape optimization method according to one embodiment of the present invention will be described with reference to the accompanying drawings.

Figure 1:
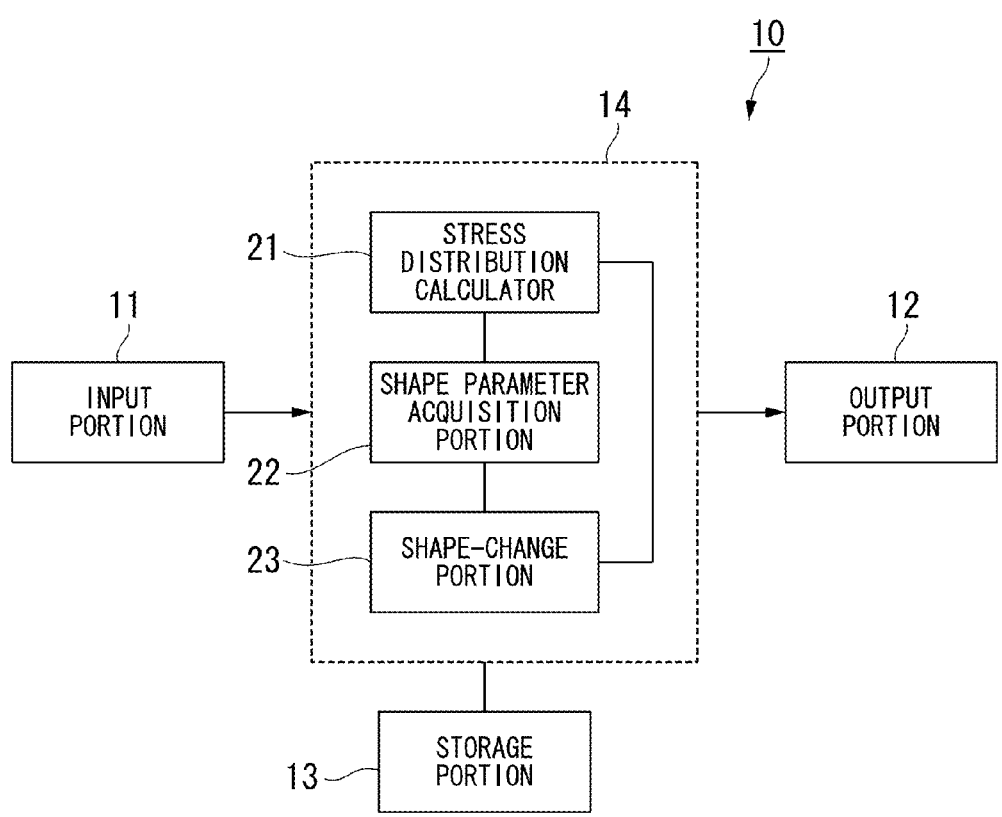
FIG. 1 is a configuration diagram of a shape optimization apparatus that achieves a shape optimization method according to an embodiment of the present invention.

As shown in FIG. 1, a shape optimization apparatus 10 that achieves the shape optimization method according to the present embodiment is configured to include, for example, an input portion 11, an output portion 12, a storage portion 13 and a processing portion 14.

Furthermore, the processing portion 14 is configured to include a stress distribution calculator 21, a shape parameter acquisition portion 22 and a shape-change portion 23.

The input portion 11 includes, for example, an input device such as a keyboard with which an operator can operate to input.

The output portion 12 includes, for example, a display device such as a liquid crystal display apparatus and a speaker, or the like.

The storage portion 13 stores various data used for the processing by the processing portion 14, for example, data of a member to be processed (such as shape and material), data of a specific load which is applied to the member to be processed, data indicating a correspondence relationship between various stresses acting on a member to be processed (such as bend stresses or membrane stresses) and shape parameters, and data generated by the processing in the processing portion 14, and the like.

Figure 2:
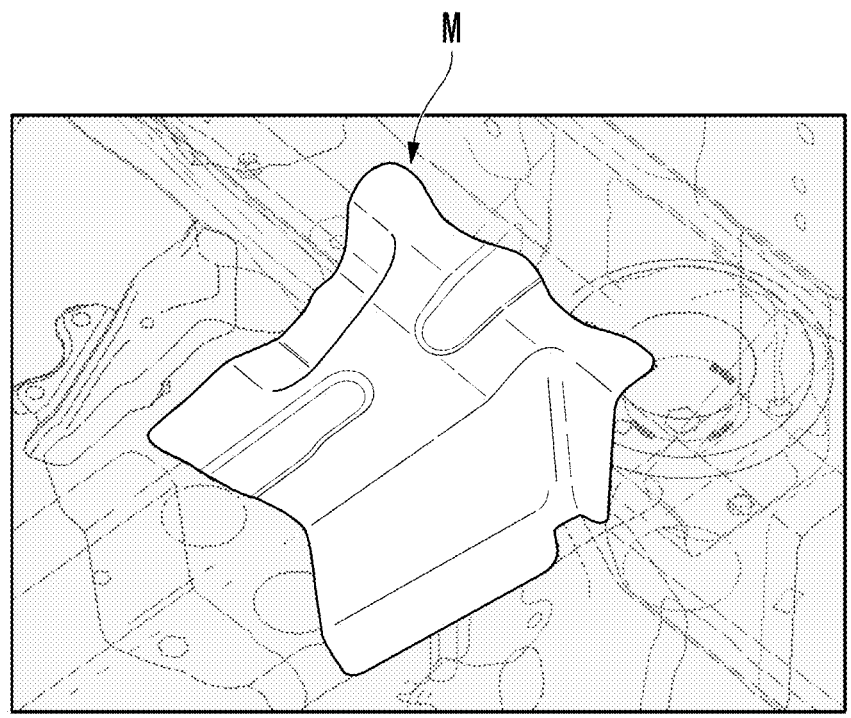
FIG. 2 is a perspective view showing a plate-like member M which is to be processed using the shape optimization method according to the embodiment of the present invention.

The processing portion 14 optimizes a shape of, for example, a plate-like member M which has a concavo-convex shape shown in FIG. 2 as a processing target with use of the various data stored in the storage portion 13.

The stress distribution calculator 21 calculates distributions of various stresses in a mode where the specific load is applied to the plate-like member M, for example, a distribution of Mises stresses, a distribution of main stresses, a distribution of bend stresses, a distribution of membrane stresses and a distribution of a ratio of the membrane stress to a sum of the bend stress and the membrane stress, and the like, and outputs the calculation result.

The shape parameter acquisition portion 22 acquires various shape parameters relating to the shape of the plate-like member M corresponding to the bend stress and the membrane stress on the basis of the calculation result output from the stress distribution calculator 21, and outputs the acquisition result.

Figure 3:
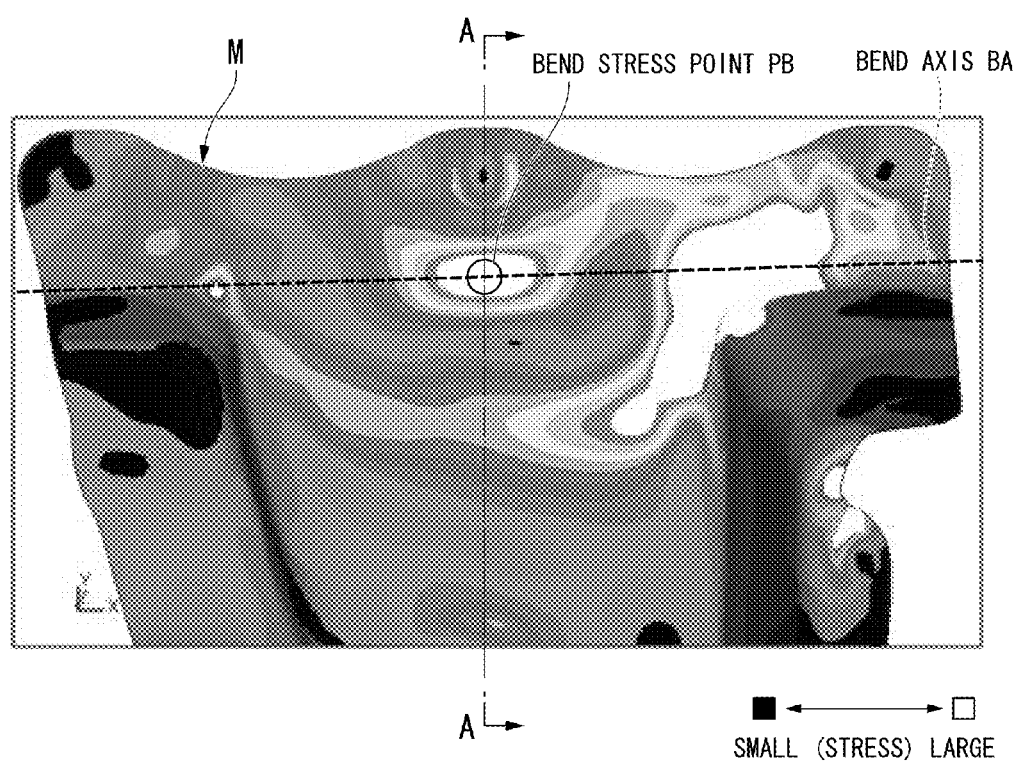
FIG. 3 is a diagram showing an example of a distribution of bend stresses in a mode where a specific load is applied to the plate-like member M which is to be processed using the shape optimization method according to the embodiment of the present invention.

For example, the shape parameter acquisition portion 22 identifies a bend stress point PB, where the bend stress is higher, from the distribution of the bend stresses shown in FIG. 3 and identifies a bend axis BA which is an axis orthogonal to stress vectors and of which magnitude is maximized from a distribution of the stress vectors around the bend stress point PB (for example, the distribution of the main stresses).

Figure 4:
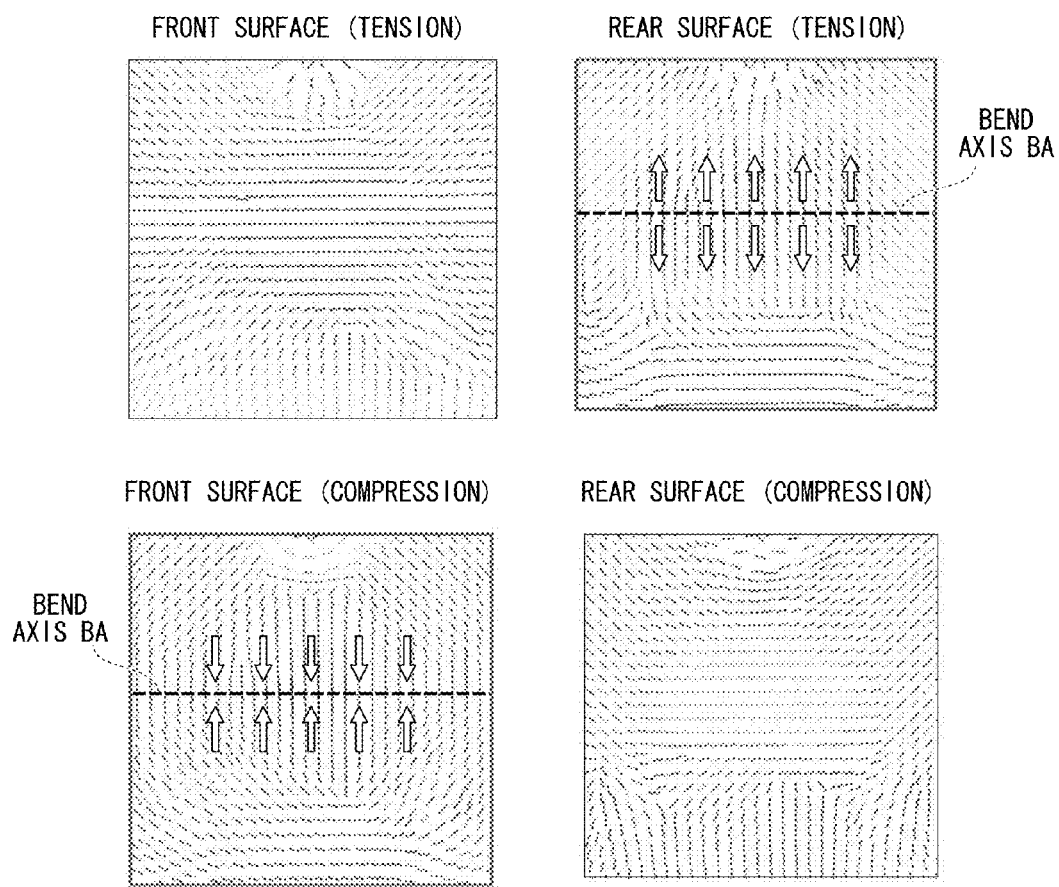
FIG. 4 is a diagram showing examples of distributions of main stresses corresponding to tension and compression which act on a front surface and a rear surface of the plate-like member M which is to be processed using the shape optimization method according to the embodiment of the present invention.
Figure 5:
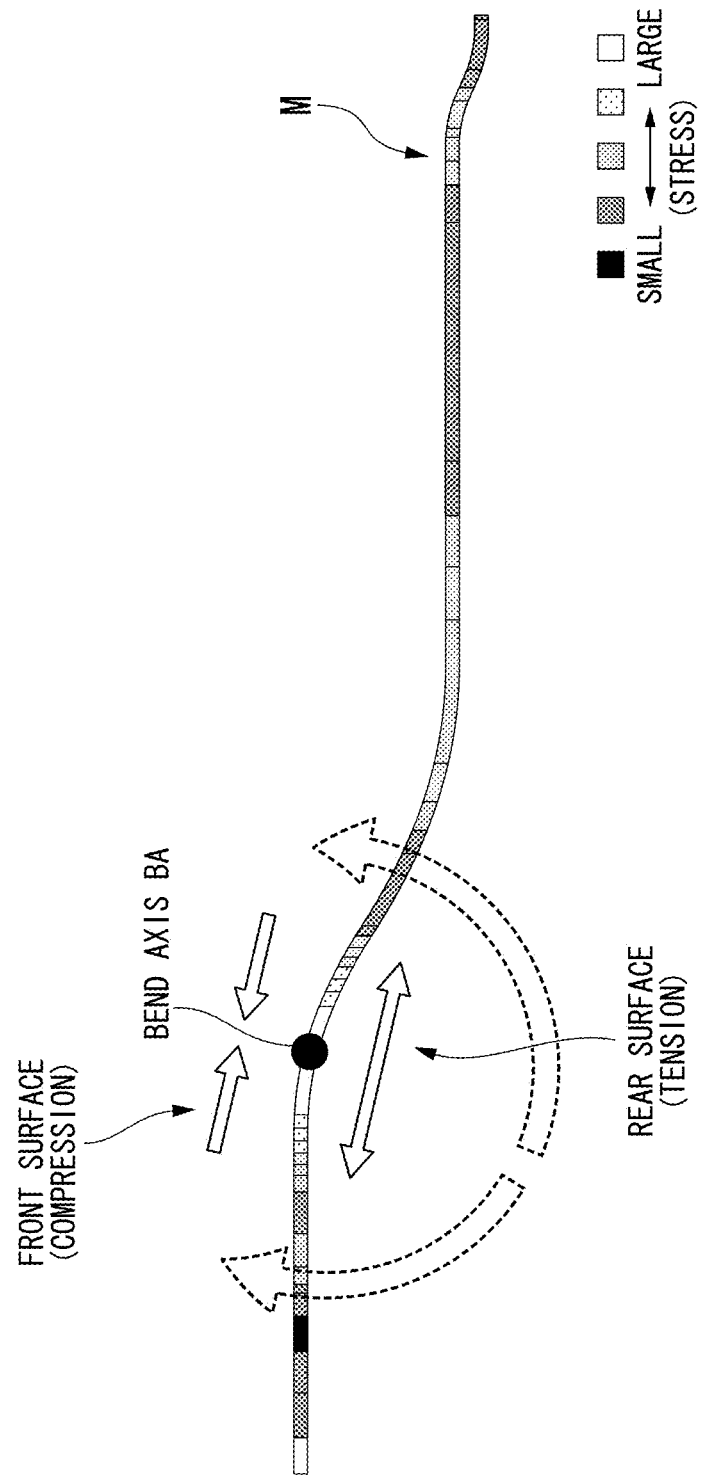
FIG. 5 is a diagram showing an example of the main stresses corresponding to tension and compression which act on a front surface and a rear surface of the plate-like member M which is to be processed using the shape optimization method according to the embodiment of the present invention.

For example, in distributions of the main stresses corresponding to a tension and a compression which act on a front surface and a rear surface of the plate-like member M shown in FIG. 4 and FIG. 5, the main stress of the compression acts on the front surface and the main stress of the tension acts on the rear surface. An axis, which is orthogonal to a direction vector of each of the main stresses and of which magnitude is maximized, is identified as the bend axis BA.

In addition, a higher bend stress indicates that, for example, the absolute value of the bend stress is greater than a predetermined value or the bend stress is relatively higher than a predetermined degree comparing with a circumference thereof.

Figure 7:
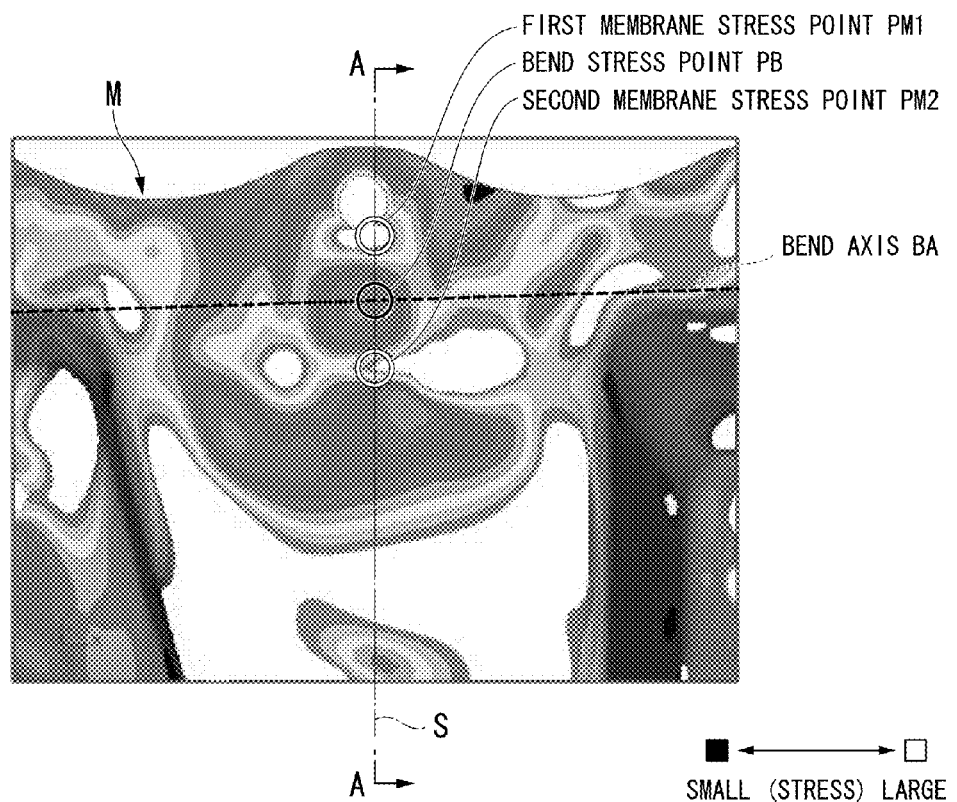
FIG. 7 is a diagram showing an example of a distribution of a ratio of the membrane stress to a sum of the bend stress and the membrane stress in a mode where a specific load is applied to the plate-like member M which is to be processed using the shape optimization method according to the embodiment of the present invention.

Then, for example, based on a distribution of bend stresses and a distribution of membrane stresses shown in FIG. 6, in a surface S orthogonal to the bend axis BA as shown in FIG. 7, the shape parameter acquisition portion 22 identifies a pair of first and second membrane stress points PM1, PM2 where a ratio of the membrane stress to a sum of the bend stress and the membrane stress (a membrane stress ratio MR=a membrane stress/(the membrane stress+a bend stress)) is higher.

Figure 8:
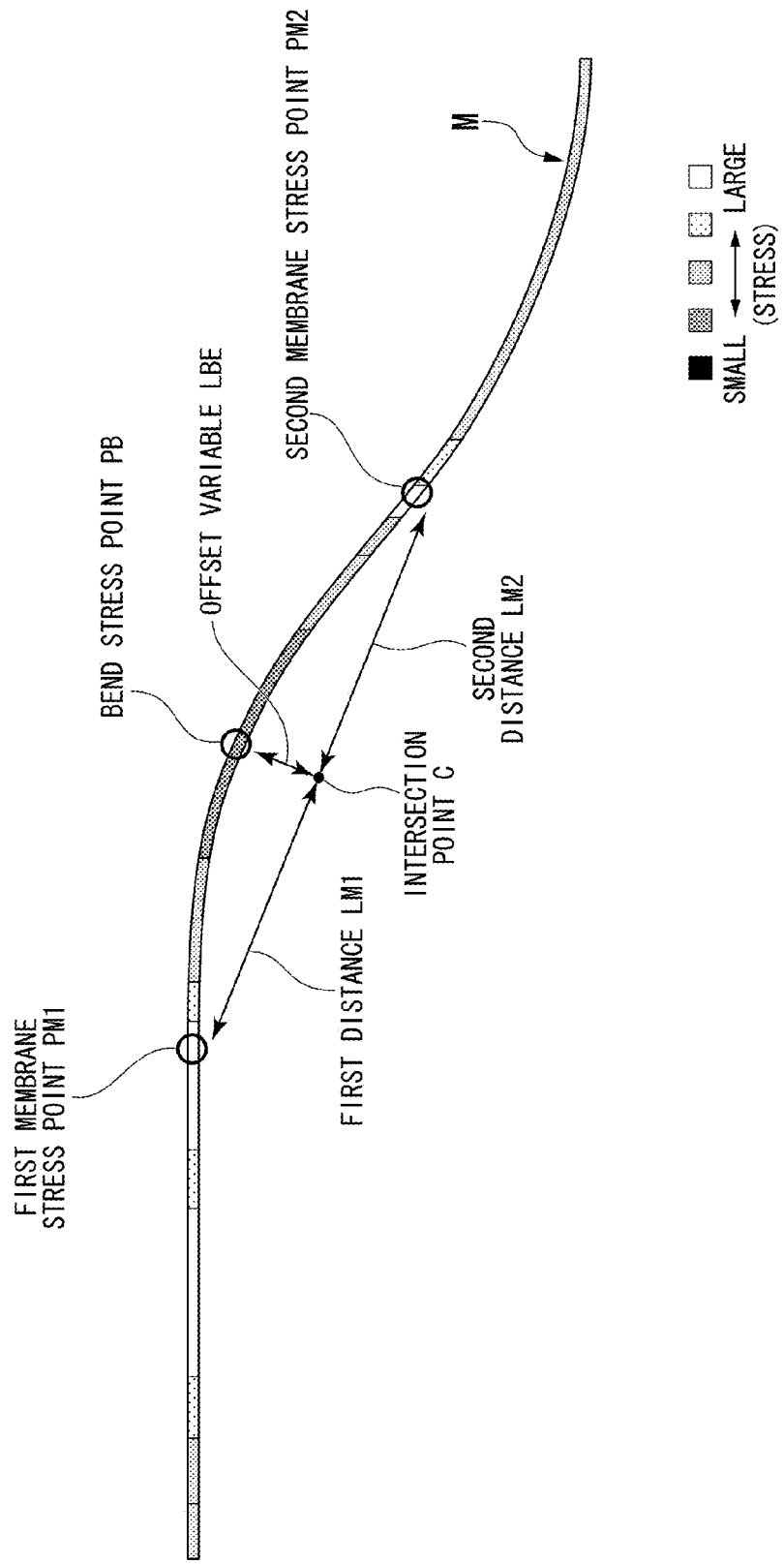
FIG. 8 is a diagram showing an example of an offset variable LBE, and a first distance LM1 and a second distance LM2 in a mode where a specific load is applied to the plate-like member M which is to be processed using the shape optimization method according to the embodiment of the present invention.

Then, for example, as shown in FIG. 8, an offset variable LBE which is a distance between a line segment, which connects the pair of the first and second membrane stress points PM1, PM2, and the bend stress point PB, is calculated as a shape parameter.

In addition, a higher ratio indicates that, for example, the absolute value of the ratio is greater than a predetermined value or the ratio is relatively higher than predetermined degree compared with a circumference thereof.

Moreover, for example, the shape parameter acquisition portion 22 calculates a first distance LM1 and a second distance LM2 which are distances from an intersection point C of a perpendicular line, which is drawn from the bend stress point PB to the line segment that connects the pair of the first and second membrane stress points PM1, PM2, to each of the pair of the first and second membrane stress points PM1, PM2 as shape parameters.

In addition, not limited to identifying one the bend stress point PB where the bend stress is higher from the distribution of the bend stresses, and the shape parameter acquisition portion 22 may identify the bend stress points PB where the bend stresses are higher and may calculate the shape parameters for each of the bend stress points PB.

The shape-change portion 23 identifies the shape of the plate-like member M so as to minimize the offset variable LBE and so as to maximize the first distance LM1 and the second distance LM2, for example, within an allowable shape range depending on requests from a designer side for the plate-like member M, with use of data indicating a corresponding relationship between various stresses stored in the storage portion 13 in advance (for example, the bend stress and the membrane stress) and the shape parameters and outputs this identification result.

In addition, if the shape parameters are calculated by the shape parameter acquisition portion 22 for each the bend stress points PB, the shape-change portion 23 may independently change the shape parameters for each the bend stress points PB or may change the shape parameters to be averagely reduced the bend stress as a whole of the bend stress points PB.

In addition, in the data indicating the correspondence relationship between the various stresses stored in the storage portion 13 in advance and the shape parameters, the offset variable LBE is a shape parameter for converting the bend stress into the membrane stress and is set so that a degree converting the bend stress into the membrane stress is changed in an increment tendency accompanied by decreasing the offset variable LBE.

Moreover, the first distance LM1 and the second distance LM2 is a shape parameter for changing the magnitude of the membrane stress and is set so that the magnitude of the bend stress is changed in a decrement tendency with further converting the bend stress into the membrane stress accompanied by increasing the first distance LM1 and the second distance LM2.

Through these, as shown, for example, in FIG. 9, after the shape-change by the shape-change portion 23, the bend stress is reduced and the membrane stress and the membrane stress ratio MR are increased compared with before the shape-change.

However, the absolute value of the stress is reduced by converting the bend stress into the membrane stress, accordingly, the Mises stress, which is the evaluative standard of the fatigue strength of the plate-like member M, is reduced compared with before the shape-change.

The shape optimization apparatus 10 according to the present embodiment includes the above-mentioned configuration. Next, an operation of the shape optimization apparatus 10, that is, a step of the shape optimization method will be described.

Figure 10:
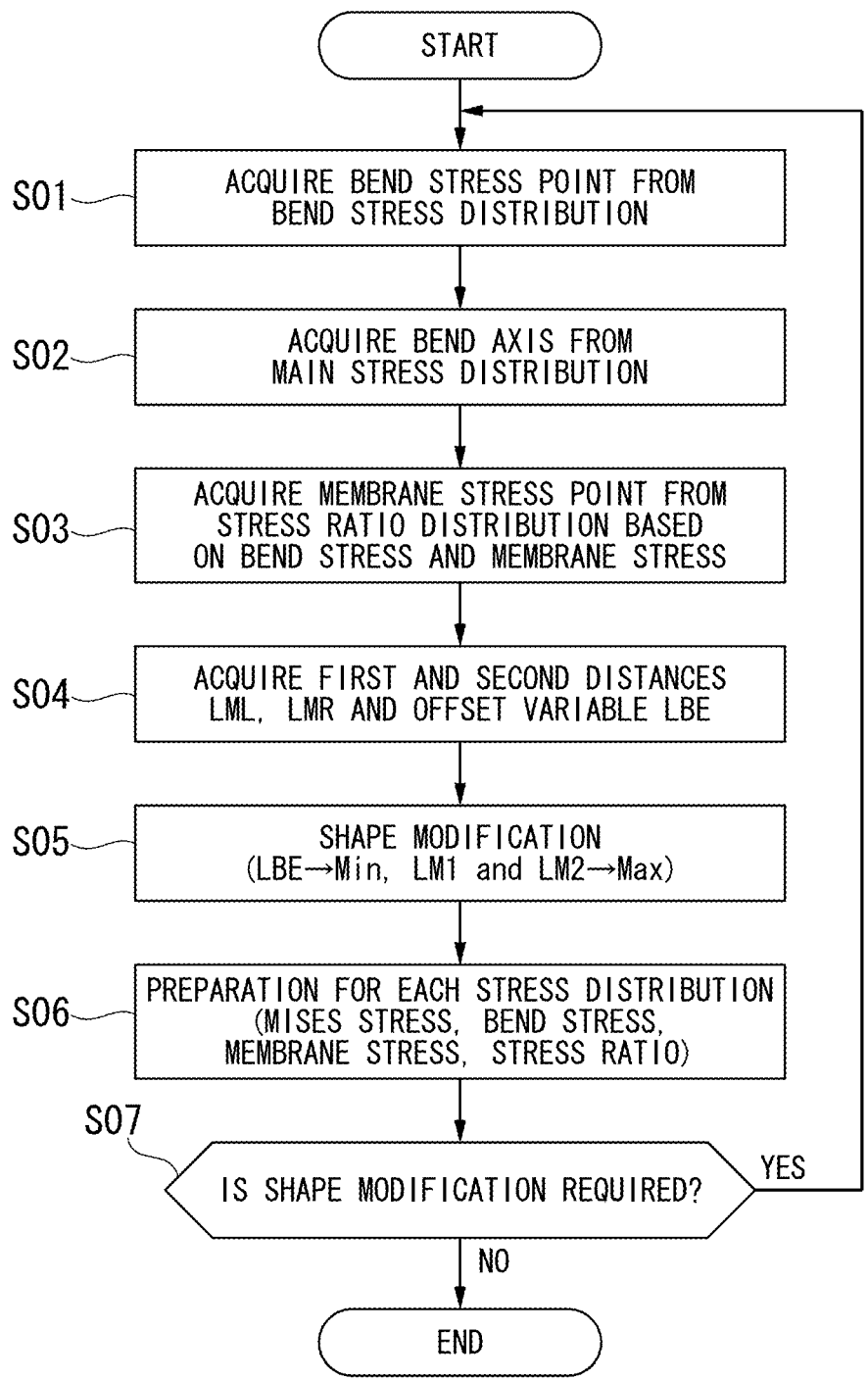
FIG. 10 is a flowchart of the shape optimization method according to the embodiment of the present invention.

First, for example, in Step S01 shown in FIG. 10, the distributions of the various stresses in the mode where the specific load is applied to the plate-like member M to be processed, for example, the distribution of the Mises stress, the distribution of the main stress, the distribution of the bend stress, the distribution of the membrane stress, and the distribution of the ratio of the membrane stress to the sum of the bend stress and the membrane stress (the membrane stress ratio MR=the membrane stress/(the membrane stress+the bend stress)), are calculated. And the bend stress point PB where the bend stress is higher is firstly identified on the basis of these calculation results.

Next, in Step S02, on the basis of the distribution of the stress vectors around the bend stress point PB (for example, the distribution of the main stresses), an axis which is orthogonal to the stress vectors and of which magnitude is maximized, for example, an axis, which is orthogonal to the direction vector of the main stresses corresponding to the tension and the compression acting on the front surface and the rear surface of the plate-like member M and of which magnitude is maximized, is identified as the bend axis BA.

Next, in Step S03, the pair of the first and second membrane stress points PM1, PM2, where a ratio of the membrane stress to a sum of the bend stress and the membrane stress in the surface S orthogonal to the bend axis BA (a membrane stress ratio MR=a membrane stress/(the membrane stress+a bend stress)) is higher, are identified.

Next, in Step S04, the offset variable LBE, which is the distance between the line segment that connects the pair of the first and second membrane stress points PM1, PM2 and the bend stress point PB, is calculated as the shape parameter.

Furthermore, the first distance LM1 and the second distance LM2 which are the distances from the intersection point C of the perpendicular line, which is drawn from the bend stress point PB to the line segment that connects the pair of the first and second membrane stress points PM1, PM2, to each of the pair of the first and second membrane stress points PM1, PM2 are calculated as the shape parameters.

Next, in Step S05, with use of the data indicating the correspondence relationship between the various stresses stored in the storage portion 13 in advance (for example, the bend stress and the membrane stress) and the shape parameters, for example, within the allowable shape range depending on the requests from the designer side for the plate-like member M, the shape of the plate-like member M is changed and is identified so as to minimize the offset variable LBE and so as to maximize the first distance LM1 and the second distance LM2.

Next, in Step S06, for the plate-like member M after the shape-change, the distributions of various stresses in a mode where a specified load is applied, for example, a distribution of a Mises stresses, a distribution of main stresses, a distribution of bend stresses, a distribution of membrane stresses, and a distribution of a ratio of the membrane stress to a sum of the bend stress and the membrane stress (a membrane stress ratio MR=a membrane stress/(the membrane stress+a bend stress)), are recalculated.

Next, in Step S07, whether or not a further shape modification is required for the plate-like member M after the shape-change is determined.

If this determination result is "YES", the step returns to Step S01 described above.

On the other hand, if this determination result is "NO", the step advances to END.

In addition, in this determination, for example, in the distribution of the Mises stresses or the distribution of the bend stresses, if there is a region where the stress value is beyond a predetermined allowable value or a region where the stress is locally concentrated, it is determined that the further shape modification is required.

In addition, in the processes of Step S01~Step S07 described above, not limited to changing the shape of the plate-like member M on the basis of the shape parameter set for one bend stress point PB, the shape of the plate-like member M may be changed on the basis of the shape parameters set in each of the bend stress points PB.

As described above, according to the shape optimization method of the present embodiment, the bend stress and the membrane stress, which are the evaluative standards of the fatigue strength of the plate-like member M, and the shape of the plate-like member M can be analyzed based on the correspondence therebetween with use of the offset variable LBE.

Furthermore, for example, within the allowable shape range depending on requests from the designer side for the plate-like member M, by identifying the shape of the plate-like member M so as to minimize the offset variable LBE, in the specific load which acts on the plate-like member M, the bend stress is converted into the membrane stress. Accordingly, the Mises stress which is the evaluative standard of the fatigue strength of the plate-like member M may be reduced, and thus the optimum shape of the plate-like member M may be appropriately identified.

Furthermore, the accuracy in analyzing the bend stress and the membrane stress, and the shape of the plate-like member M based on a correspondence thereamong can be improved with use of the first distance LM1, the second distance LM2, and the offset variable LBE.

Furthermore, for example, within the allowable shape range depending on the requests from the designer side for the plate-like member M, by identifying the shape of the plate-like member M so as to maximize the first distance LM1 and the second distance LM2, the bend stress is further converted into the membrane stress and therefore the bend stress can be reduced. Accordingly, the Mises stress which is the evaluative standard of the fatigue strength of the plate-like member M can be reduced much more, and the optimum shape of plate-like member M can be appropriately identified.

Then, in the case of repeatedly executing the shape optimization method, the shape parameter based on the offset variable LBE, the first distance LM1 and the second distance LM2 can be independently and flexibly set without depending on, for example, an initial setting and a past setting; the appropriate shape-change depending on the stress can be performed; and the accuracy of the shape optimization can be improved.

Figure 11:
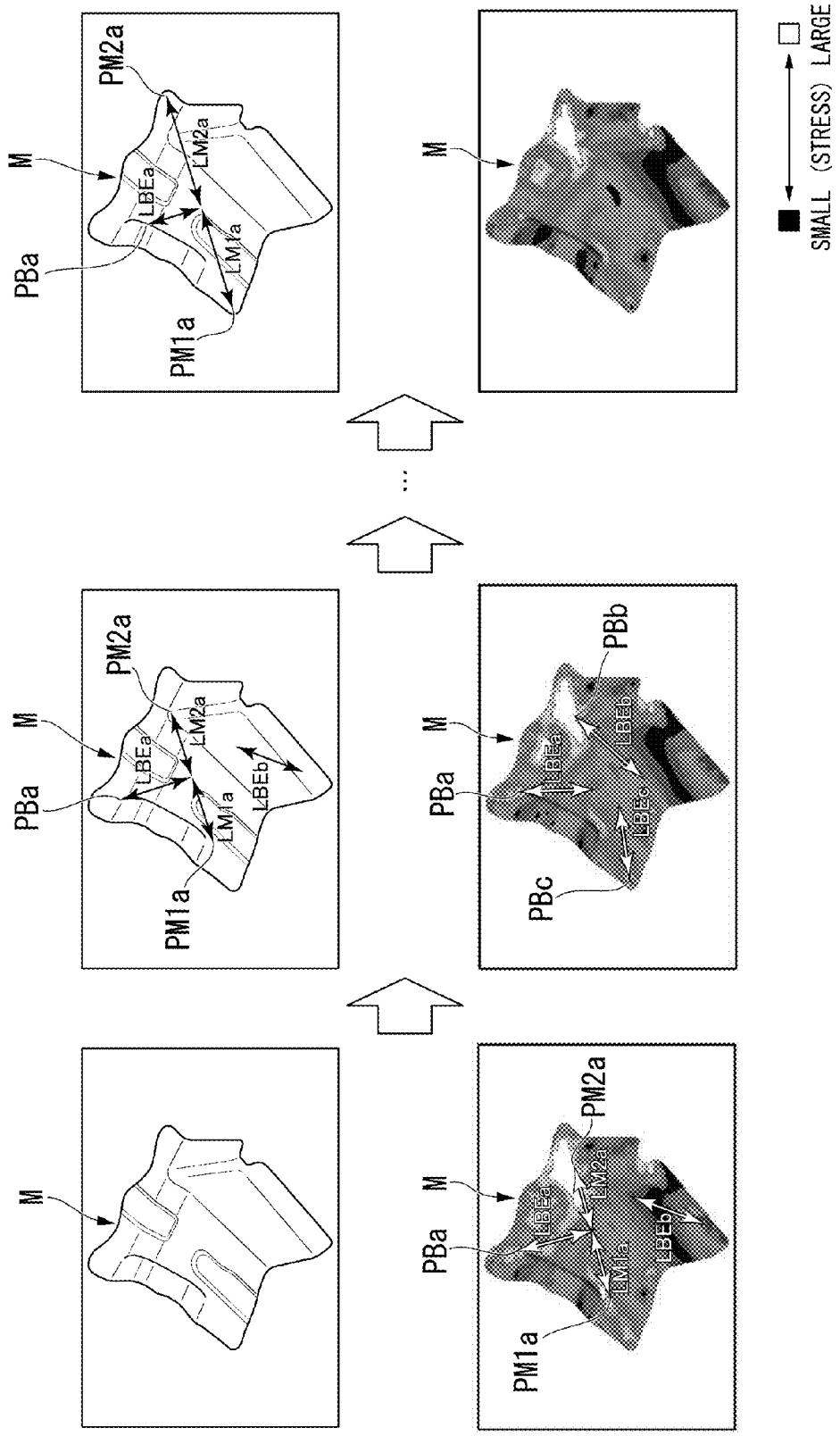
FIG. 11 is a diagram showing examples of shape parameters which are set in a case of repeatedly executing the shape optimization method in a mode where a specific load is applied to the plate-like member M which is to be processed using the shape optimization method according to the embodiment of the present invention.

According to the invention of the present application, by repeatedly executing the processes of the shape optimization method of Step S01~Step S07 in the embodiment described above, for example, as shown in FIG. 11, the bend stress points PB (for example, PBa, PBb, Pbc) and the pair of the first and second membrane stress points PM1, PM2 (for example, PM1$a$, PM2$a$) are newly reset for each renewal of the distribution of the stresses. Then, the shape parameter based on the offset variables LBE (for example, LBEa, LBEb, LBEc), the first distance LM1 and the second distance LM2 (for example, LM1$a$, LM2$a$) are newly reset without depending on, for example, the initial setting and the past setting.

Figure 12:
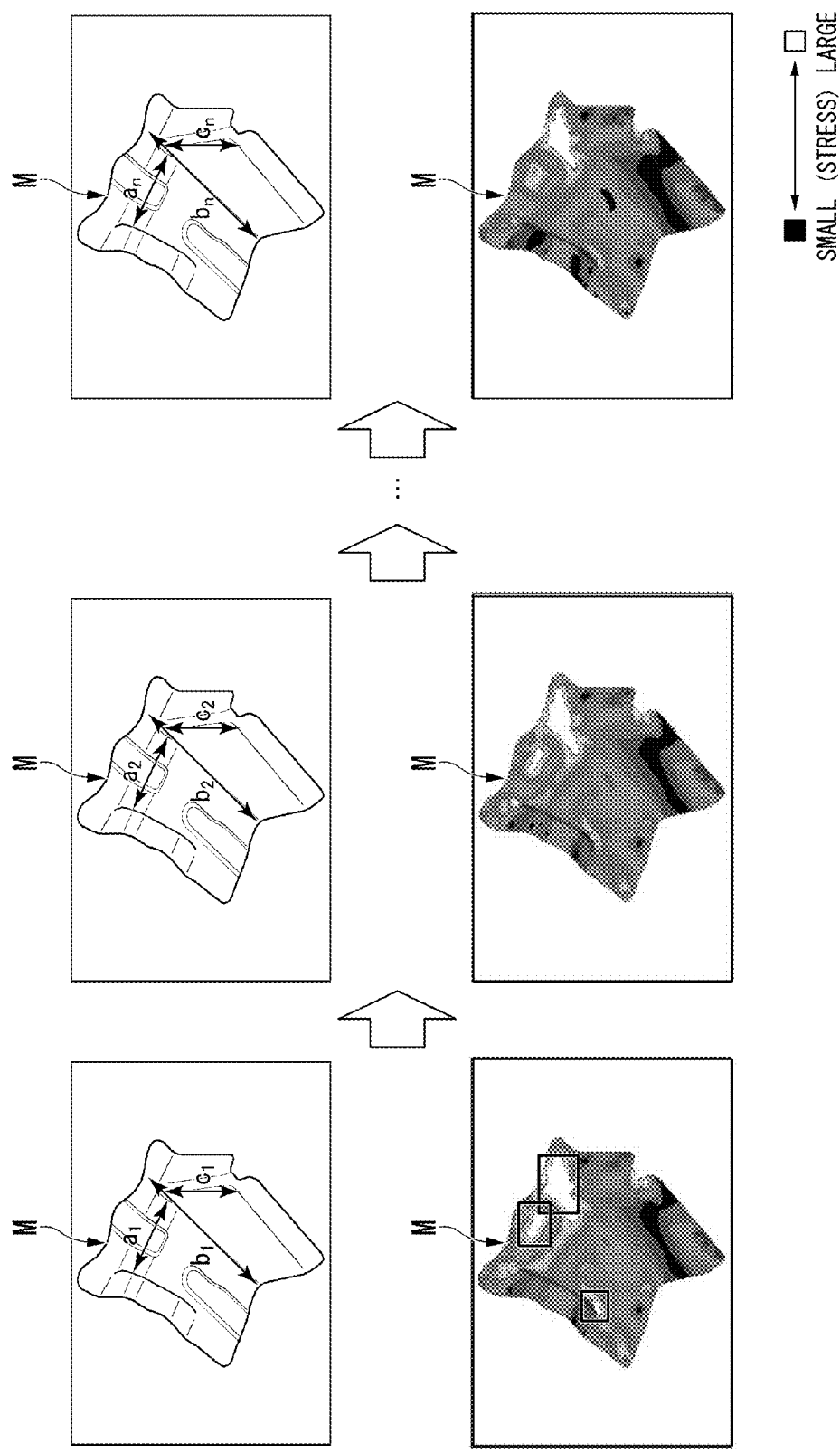
FIG. 12 is a diagram in a conventional technology showing examples of shape parameters which are set when the shape-change is repeated in a mode where a specific load is applied to the plate-like member M.

For example, in the related art shown in FIG. 12, since only the magnitudes of the values of shape parameters, which are fixed in a position and a direction (for example, the width a, the length b, the height c), are changeable within only the shape range depending on initial values of shape parameters (for example, the width a1, the length b1, the height c1), an evaluation region is locally limited. Compared to this, according to the invention of the present application, shape parameters can be independently, flexibly and fluidly set for past settings, and thus, an entire shape of the plate-like member M can be appropriately optimized without limiting the evaluation region.

In addition, in the embodiment described above, in a case where the plate-like member M is a member constituting a vehicle body, the specific load, which is applied to the plate-like member M, indicates the vibration which acts on the vehicle body when the vehicle drives on rough roads, the acceleration which acts on the vehicle body when the vehicle sharply turns, or the like.

In the embodiment described above, in a case of repeatedly executing the shape optimization method to identify the shape of the plate-like member M, the offset variable LBE, the first distance LM1 and the second distance LM2 are re-identified in the shape of the plate-like member M identified in a previous execution. However, not limited to this, instead of re-identifying all of these shape parameters, at least any one of the offset variable LBE, and the first distance LM1 and the second distance LM2 may be re-identified.

In this case, a calculation load when repeating the shape-change of the plate-like member M may be reduced, the flexibility for resetting the shape parameter can be improved, and the accuracy of the shape optimization may be improved.

Figure 13:
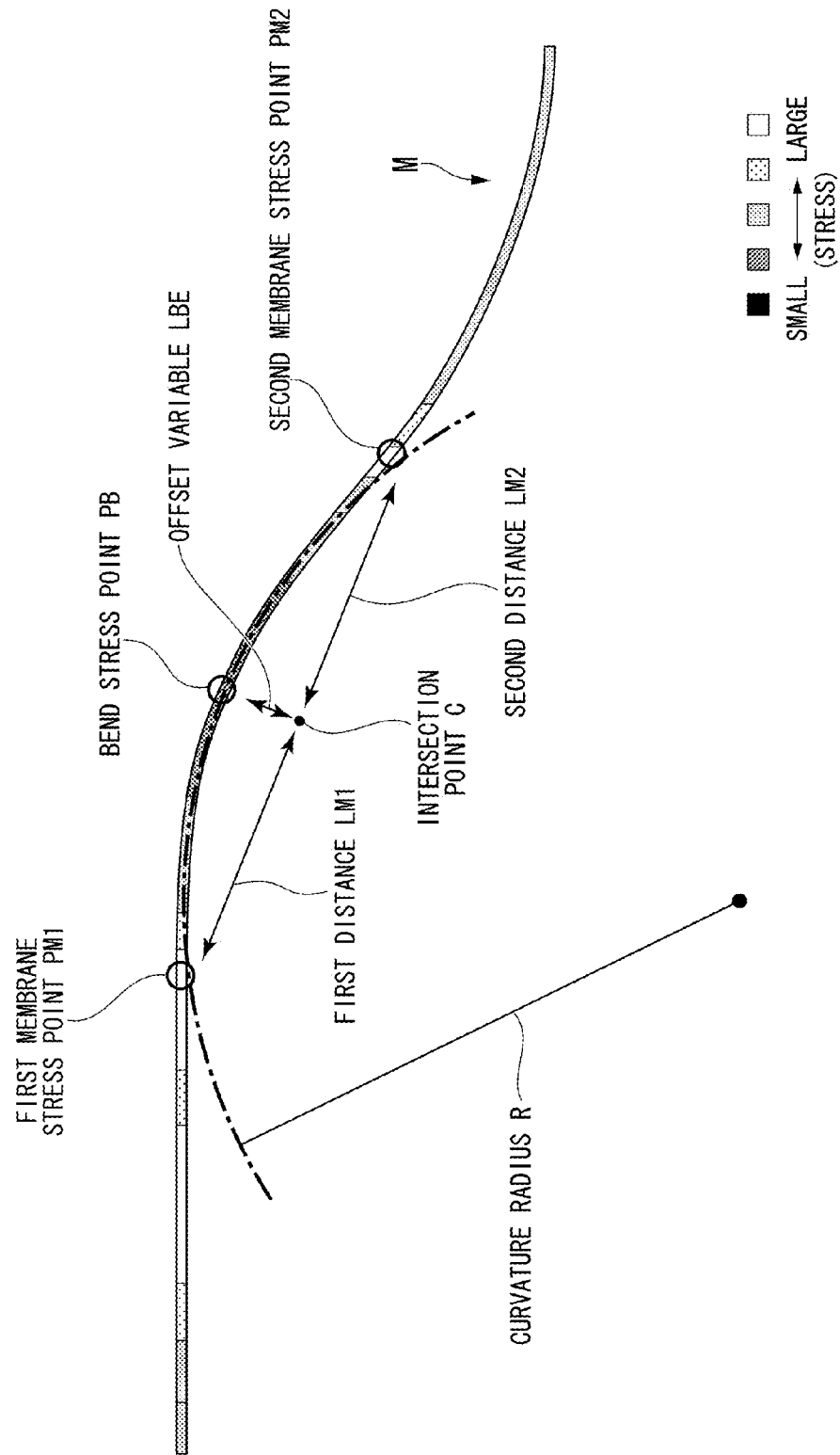
FIG. 13 is a diagram showing an example of shape parameters in a mode where a specific load is applied to the plate-like member M which is to be processed using a shape optimization method according to a modified example of the embodiment of the present invention.

In addition, in the embodiment described above, the first distance LM1 and the second distance LM2 are used as the shape parameters for changing the magnitude of the membrane stress. However, not limited to this, other parameters, for example, a circular curvature radius R shown in FIG. 13 which includes the bend stress point PB, the pair of the first and second membrane stress points PM1, PM2 may be used as reference values.

In addition, in the above-described embodiment, the shape optimization apparatus 10 may be implemented by dedicated hardware, or may be composed of a memory and a CPU to load and run the shape optimization program which achieves the function of the shape optimization apparatus 10 to the memory.

In addition, a program for achieving the shape optimization according to the present invention described above may be recorded on a recording medium that can be read by a computer, the program recorded on the recording medium may be loaded into a computer system, and that program may then be run to perform position detection processing.

Furthermore, the "computer system" referred to here includes an OS, peripherals and other hardware.

In addition, in the case of utilizing a WWW system, the "computer system" also includes a web site providing environment (or display environment).

In addition, a "recording medium that can be read by a computer" refers to a flexible disc, magneto-optical disc, ROM, CD-ROM or other portable media as well as a storage device such as a hard disk built into the computer system.

Furthermore, the computer readable storage medium, such as communication lines short period of time in a program for sending via the communication line such as telephone networks and the Internet, the program shall be maintained dynamically as volatile memory inside the computer system of servers and clients in this case, and shall also include a program that holds in a certain time.

The above program also may be intended to achieve some of the features listed above, may also be what can be achieved in conjunction with programs that are already stored on the computer system the features listed above.

What is claimed is:

1. A shape optimization method of a plate-like member which has a concavo-convex shape, the method comprising:
   identifying a bend stress point of the plate-like member as a point of one or more points of the plate-like member where a specific load is applied to the plate-like member such that a bend stress of the bend stress point is higher than corresponding bend stresses from a distribution of other points of the plate-like member;
   identifying a bend axis from a distribution of stress vectors around the bend stress point;
   identifying a pair of membrane stress points of the plate-like member from the one or more points based on a distribution of bend stresses and a distribution of membrane stresses,
   where the pair of membrane stress points are in an orthogonal surface to the bend axis, and
   where a ratio of a membrane stress to a sum of the bend stress and the membrane stress for the pair of membrane stress points is higher than corresponding ratios for other points of the plate-like member, said membrane stress ratio being described using the following formulation:

$$MR = \frac{\text{a Membrane Stress}}{\text{the Membrane Stress} + \text{a Bend Stress}};$$

calculating an offset variable which is a distance between a line segment connecting the pair of the membrane stress points and the bend stress point;
   identifying a shape of an optimized shape for the plate-like member such that the identified optimized shape minimizes the offset variable,
   wherein at least one of the identifying the bend stress point, the identifying the bend axis, the identifying the pair of membrane stress points, the calculating the offset variable, or the identifying the optimized shape of the plate-like member is stored in memory or implemented via a central processing unit; and
   outputting, on a computer display, a representation of the optimized shape for the plate-like member.

2. The shape optimization method according to claim 1, further comprising:
   calculating a first distance and a second distance that are distances from an intersection point to the pair of membrane stress points, wherein a perpendicular line drawn from the bend stress point to the line segment formed by the first distance and the second distance is indicative of the offset variable; and
   identifying the optimized shape of the plate-like member so as to maximize the first and second distances.

3. The shape optimization method according to claim 2, wherein, in a case of repeatedly executing the shape optimization method to identify the optimized shape of the plate-like member,
   re-identifying the bend stress point and the pair of the membrane stress points in the optimized shape of the plate-like member which is identified in a previous execution, and
   re-calculating the offset variable and the first and second distances based on the re-identified bend stress point and the re-identified pair of the membrane stress points.

4. The shape optimization method according to claim 1, wherein, in a case of repeatedly executing the shape optimization method to identify the optimized shape of the plate-like member,
   re-identifying the bend stress point and the pair of the membrane stress points in the optimized shape of the plate-like member identified in a previous execution, and
   re-calculating the offset variable based on the re-identified bend stress point and the re-identified pair of the membrane stress points.

5. The shape optimization method according to claim 2, wherein, in a case of repeatedly executing the shape optimization method to identify the optimized shape of the plate-like member,
   re-identifying the bend stress point and the pair of the membrane stress points in the optimized shape of the plate-like member identified in a previous execution, and
   re-calculating the offset variable based on the re-identified bend stress point and the re-identified pair of the membrane stress points.

6. The shape optimization method according to claim 1, wherein the identifying the bend stress point, the identifying the bend axis, the identifying the pair of membrane stress points, the calculating the offset variable, and the identifying the optimized shape of the plate-like member is implemented via at least one processor of the central processing unit.

* * * * *